(12) United States Patent
Okajima

(10) Patent No.: US 6,759,333 B2
(45) Date of Patent: Jul. 6, 2004

(54) SEMICONDUCTOR DEVICE AND METHOD OF MANUFACTURING THE SAME

(75) Inventor: Mutsumi Okajima, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 11 days.

(21) Appl. No.: 10/237,690

(22) Filed: Sep. 10, 2002

(65) Prior Publication Data

US 2004/0009661 A1 Jan. 15, 2004

(30) Foreign Application Priority Data

Jul. 10, 2002 (JP) .................................. 2002-201441

(51) Int. Cl.$^7$ ............................................. H01L 21/44
(52) U.S. Cl. .................. 438/687; 438/677; 438/622; 438/618; 438/253; 438/240; 438/238; 438/243; 438/246; 438/629; 438/656; 438/637; 438/303; 257/379; 257/754; 257/640; 257/635
(58) Field of Search .................. 438/677, 622, 438/618, 253, 240, 238, 243, 246, 629, 656, 637, 303, 687; 257/379, 754, 640, 635

(56) References Cited

U.S. PATENT DOCUMENTS 6,312,982 B1 * 11/2001 Takato et al. ............... 438/238

6,444,530 B1 * 9/2002 Chen et al. ................. 438/303
6,635,528 B2 * 10/2003 Gilbert et al. .............. 438/253
2002/0042193 A1 * 4/2002 Noguchi et al. ............ 438/687

FOREIGN PATENT DOCUMENTS

JP  2001-135721  5/2001

* cited by examiner

Primary Examiner—Matthew Smith
Assistant Examiner—Victor V Yevsikov
(74) Attorney, Agent, or Firm—Finnegan, Henderson, Farabow, Garrett & Dunner, L.L.P.

(57) ABSTRACT

A semiconductor device comprises a first conductor formed inside or on the top surface of a semiconductor substrate; an insulating film formed on the top surface of said semiconductor substrate or on the top surface of said first conductor; contact holes penetrating said insulating layer to reach said first conductor; a second conductor filled inside said contact holes and electrically connected to said first conductor; and an interconnection extending across contact regions on a top surface region of said insulating layer where said contact holes are formed respectively, and having opposite sides at least one of which is in contact with said second conductor inside said contact regions.

13 Claims, 10 Drawing Sheets

NAND PRODUCT

DRAM PRODUCT

SEMICONDUCTOR DEVICE AND METHOD OF MANUFACTURING THE SAME

CROSS-REFERENCE TO RELATED APPLICATION

This application is based upon and claims the benefit of priority from the prior Japanese Patent Application No. 2002-201441, filed on Jul. 10, 2002, the entire contents of which are incorporated herein by reference.

BACKGROUND OF THE INVENTION

1. Field of the Invention

This invention relates to a semiconductor device and its manufacturing method.

2. Related Background Art

Dual damascene process has been used as a technique for making contact holes and interconnections in DRAM-type semiconductor and NAND-type semiconductor storage devices (such as NAND-type flash memory).

FIGS. 4A and 4B are plan views show in a part of bit line interconnections of a DRAM product and NAND product both made by using conventional dual damascene process. Circles drawn by broken lines in FIGS. 4A and 4B indicate contact regions C where contact holes in the cell area are formed.

In general, contact regions C of DRAM are not juxtaposed to each other but located to be close to neighboring interconnections as shown in FIG. 4A. In contrast, contact regions C in the memory cell area of NAND product are juxtaposed as shown in FIG. 4B.

As shown in FIGS. 4A and 4B, each contact region C bulges out toward adjacent interconnections or adjacent contact regions of adjacent interconnections, making the distance between adjacent interconnections in locations of the contact regions very narrows. Therefore, there is a high possibility of short-circuiting between adjacent interconnections. In the NAND product having juxtaposed contact regions C, the possibility of short-circuiting between adjacent interconnections is especially high around the contact regions.

FIG. 5 is a cross-sectional view of the semiconductor device shown in FIG. 4A, taken along the X—X line of FIG. 4A. The silicon substrate 10 includes element-isolating portions 20 and doped silicon regions 30 in its top surface region. A silicon nitride film 40 and a silicon oxide film 50 are formed to overlie the top surface of the silicon substrate 10. Contact holes 60 are formed to penetrate the silicon nitride film 40 and the silicon oxide film 50, and the contact holes 60 are filled with doped polycrystalline silicon 70. Furthermore, interconnections 2 made up of two kinds of metal layers 80, 90 are formed to overlie the doped polycrystalline silicon 70 and to embed the silicon oxide film 50.

As shown in FIG. 5, in conventional semiconductor devices, width $L_1$ of the interconnection 2 in each contact region C is larger than the diameter R of the contact hole 60, and this results in decreasing the line-to-line distance S beside the contact region C. A reason why the width $L_1$ becomes larger than the diameter R lies in the conventional semiconductor device manufacturing method. To clarify this problem, the conventional method for manufacturing a semiconductor device is explained below.

FIGS. 6A through 6J are cross-sectional views of the conventional semiconductor device manufacturing method in the order of its processes.

In FIG. 6A, trench capacitors, impurity diffusion layers, gate interconnection layers (all not shown) and isolations 20 are already formed in a silicon substrate 10. In this process, a silicon nitride film 40 and a silicon oxide film 50 are deposited and planerized as a layer-to-layer insulating film on the top surface of the silicon substrate 10.

In FIG. 6B, the silicon oxide film 50 and the silicon nitride film 40 are next removed selectively by photolithography technique and dry etching to create contact holes 60 of bit lines in the cell area of DRAM.

In FIG. 6C, the structure next undergoes processing by hydrofluoric acid to remove the naturally oxidized films on bottoms of the contact holes 60. This hydrofluoric acid processing is named the first hydrofluoric acid processing herein below.

In FIG. 6D, the doped polycrystalline silicon 70 doped with an N-type impurity is next deposited by LP-CVD, and thereafter selectively removed from the top surface of the silicon oxide layer 50 and partly from inside the contact holes 60.

In FIG. 6E, contact holes 61 are next formed in the peripheral circuit area by photolithography technique and dry etching.

In FIG. 6F, a coat film 91 is applied to prevent from reflection in the later photolithographic process, and in FIG. 6G, the coat film 91 and the silicon oxide film 50 are selectively removed by photolithography technique and dry etching to create bit line interconnection trenches 92. In FIG. 6H, the photo resist 93 and the coat film 91 are removed.

In FIG. 6I, the structure next undergoes hydrofluoric acid processing for the purpose of removing the naturally oxidized film from the exposed part of the silicon substrate 10 and from the top surface of the doped polycrystalline silicon 70. This hydrofluoric acid processing is named the second hydrofluoric acid processing herein below.

In FIG. 6J, titanium 94 is next deposited by sputtering and annealed in an $N_2$ atmosphere. Thereby, titanium silicide is formed on the bottom of the contact, holes 61 in the peripheral circuit area and on top surfaces of the doped silicon 70 in the cell area. Titanium 94 on the parts other than the bottoms of the contact holes 61 and the top surfaces of the doped polycrystalline silicon 70 is nitrified. After that, tungsten is deposited, and it is partly removed together with the titanium nitride from the top surf ace of the silicon oxide film 50 by CMP, thereby to obtain the semiconductor device having the structure shown in FIG. 5.

In this conventional manufacturing, process, the diameter of each contact hole 60 is enlarged by the first hydrofluoric acid processing as shown in FIG. 6C. Additionally, the upper part of each contact hole 60 above the doped silicon 70 is further enlarged in diameter by the second hydrofluoric acid processing as shown in FIG. 6I.

Due to this second hydrofluoric acid processing, width $L_1$ of the interconnection 2 becomes wider than the diameter R of the contact hole 60. As a result, as shown in FIG. 4A, the line-to-line distance S of bit lines in the memory cell area inevitably decreases.

A countermeasure against this problem might be to start with a smaller diameter of the contact hole 60 (FIG. 6B) and a smaller width of the bit line interconnection (FIG. 6G). However, in DRAM products, the pitch of the bit line interconnections in the cell area is determined according to the minimum design rule acceptable for photolithography technique in order to minimize the area of the memory cell area. Therefore, it is difficult to further decrease the photo resist space size. Also, for decreasing the diameter of the opening pattern of the photo resist in the process of forming the contact hole 60, there is a limit in view of the capability of photolithography technique. Furthermore, even if the diameter of the opening pattern of the photo resist can be decreased in the process of forming the contact hole 60, it may lead the problem of undesirable increase of the contact resistance.

These problems are similarly involved in other products (for example, NAND products as shown in FIG. 4B) that are similar to DRAM products in structure.

As such, it is desirable to provide a semiconductor device and its manufacturing method capable of preventing undesirable short-circuiting between interconnections by securing a wider distance between adjacent interconnections beside each contact region than the conventional one.

SUMMARY OF THE INVENTION

A semiconductor device according to an embodiment of the invention comprises: a first conductor formed inside or on the top surface of a semiconductor substrate; an insulating film formed on the top surface of said semiconductor substrate or on the top surface of said first conductor; contact holes penetrating said insulating layer to reach said first conductor; a second conductor filled inside said contact holes and electrically connected to said first conductor; and an interconnection extending across contact regions on a top surface region of said insulating layer where said contact holes are formed respectively, and having opposite sides at least one of which is in contact with said second conductor inside said contact regions.

A method of manufacturing a semiconductor device according to an embodiment of the invention comprises: forming a first conductor inside or on the top surface of a semiconductor substrate; forming an insulating layer on the top surface of said semiconductor substrate or on the top surface of said first conductor; forming contact holes penetrating said insulating layer to reach said first conductor; filling a second conductor inside said contact holes; forming a interconnection trench which extends across contact regions on a top surface region of said insulating layer where said contact holes are formed respectively, and extends across said second conductor inside said contact regions; and filling a third conductor inside said interconnection trench.

DETAILED DESCRIPTION

Figure 1:
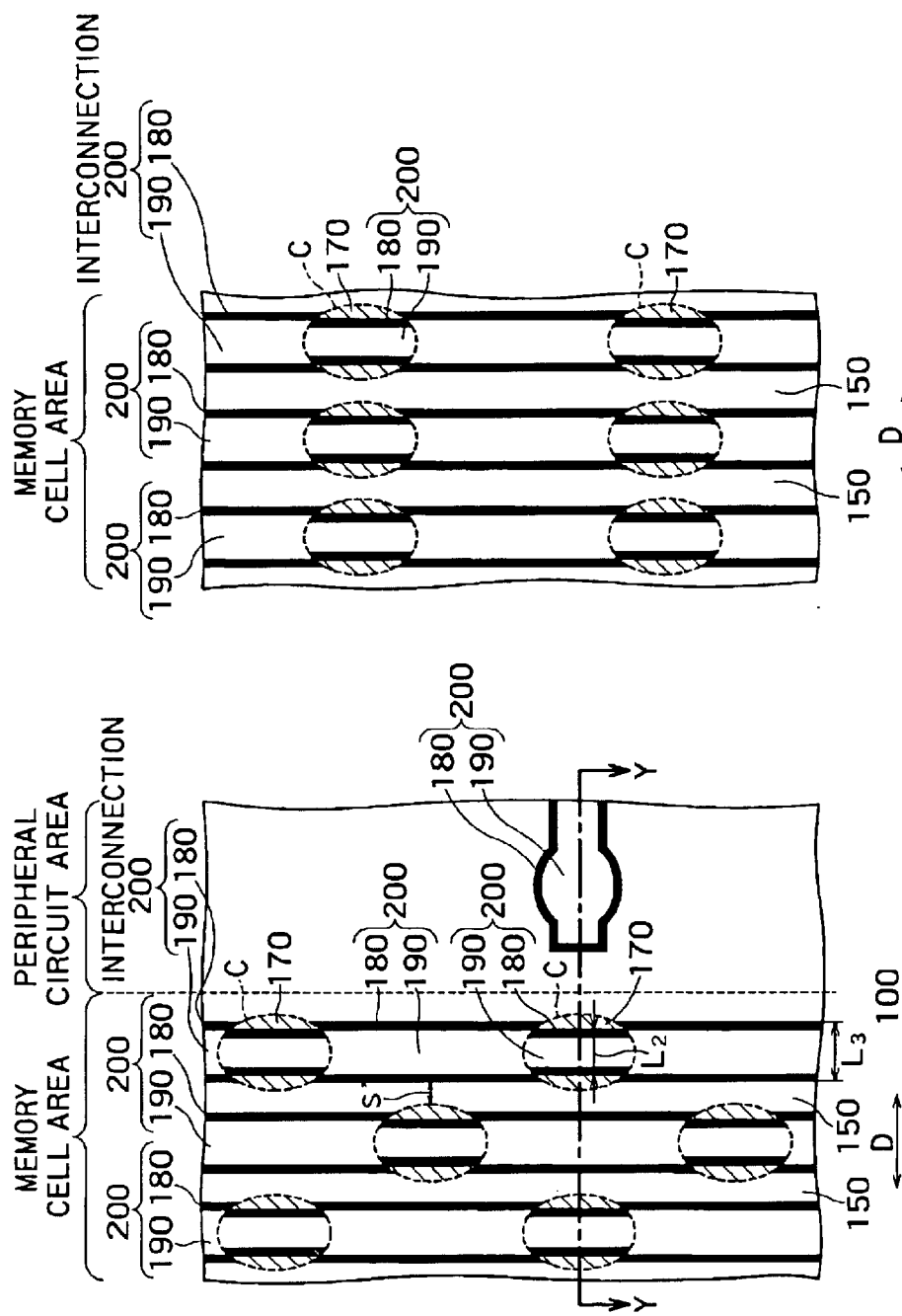
FIG. 1A is a plan view that shows a part of a DRAM-type product according to an embodiment of the invention in an enlarged scale.
FIG. 1B is a plan view that shows a part of a NAND-type product according to an embodiment of the invention in an enlarged scale.

An embodiment of the invention is explained below with reference to the drawings. The embodiment does not limit the invention.

FIG. 1A and FIG. 1B are enlarged plan views that partly show semiconductor devices according to embodiments of the invention. FIG. 1A shows a memory cell area and a periphery circuit area of a DRAM-type product. FIG. 1B shows just a memory cell area of a NAND-type product.

Elongate circles drawn by broken lines in FIGS. 1A and 1B indicate contact regions C where contact holes in the cell area are formed. A plurality of bit line interconnections 200 (hereinafter simply called interconnections 200) extend substantially in parallel across contact regions C. Each interconnection 200 is made up of two metal compound layers, such as titanium nitride layer 180 and tungsten layer 190. Contact regions C and interconnections 200 are buried in the top surface region of a silicon oxide film 150 formed as an insulating layer. Therefore, part of the silicon oxide film 150 lies between adjacent interconnection 200, and adjacent interconnections 200 are electrically insulated from each other.

Inside each contact region C, doped polycrystalline silicon 170 used as a conductor is in contact with opposite sides of the interconnection 200. Thereby, the doped polycrystalline silicon 170 is electrically connected to the interconnection 200. That is, inside each contact region C, the interconnection 200 is buried into the doped polycrystalline silicon 170, and opposite sides of the interconnection 200 are in contact with the doped polycrystalline silicon 170 and lie inside the doped polycrystalline silicon 170. Outside the contact regions C, opposite sides of each interconnection 200 are in contact with the silicon oxide film 150. Width $L_2$ of the interconnection 200 inside each contact region C is narrower than width $L_3$ of the interconnection 200 outside the contact region C.

In general, contact regions C in the memory cell area of a DRAM product do not align side by side with each other, but each contact region C aligns side by side with stems of neighboring interconnections 200. In other words, in the top surface region of the silicon oxide film 150, if an imaginary line is drawn to cross the center of a contact region C of a particular interconnection 200 normally (in the arrow D direction) to the extending direction of the interconnections 200, contact regions C and stems between contact regions alternately appear along the imaginary line.

In the NAND product, however, contact regions in the memory cell area align side by side among different interconnections 200 as shown in FIG. 1B. In other words, in the top surface region of the silicon oxide film 150, if an imaginary line is drawn to cross the center of a contact region C of a particular interconnection 200 normally (in the arrow D direction) to the extending direction of the interconnections .200, contact regions C always appear on all interconnections 200 along the imaginary line.

Figure 2:
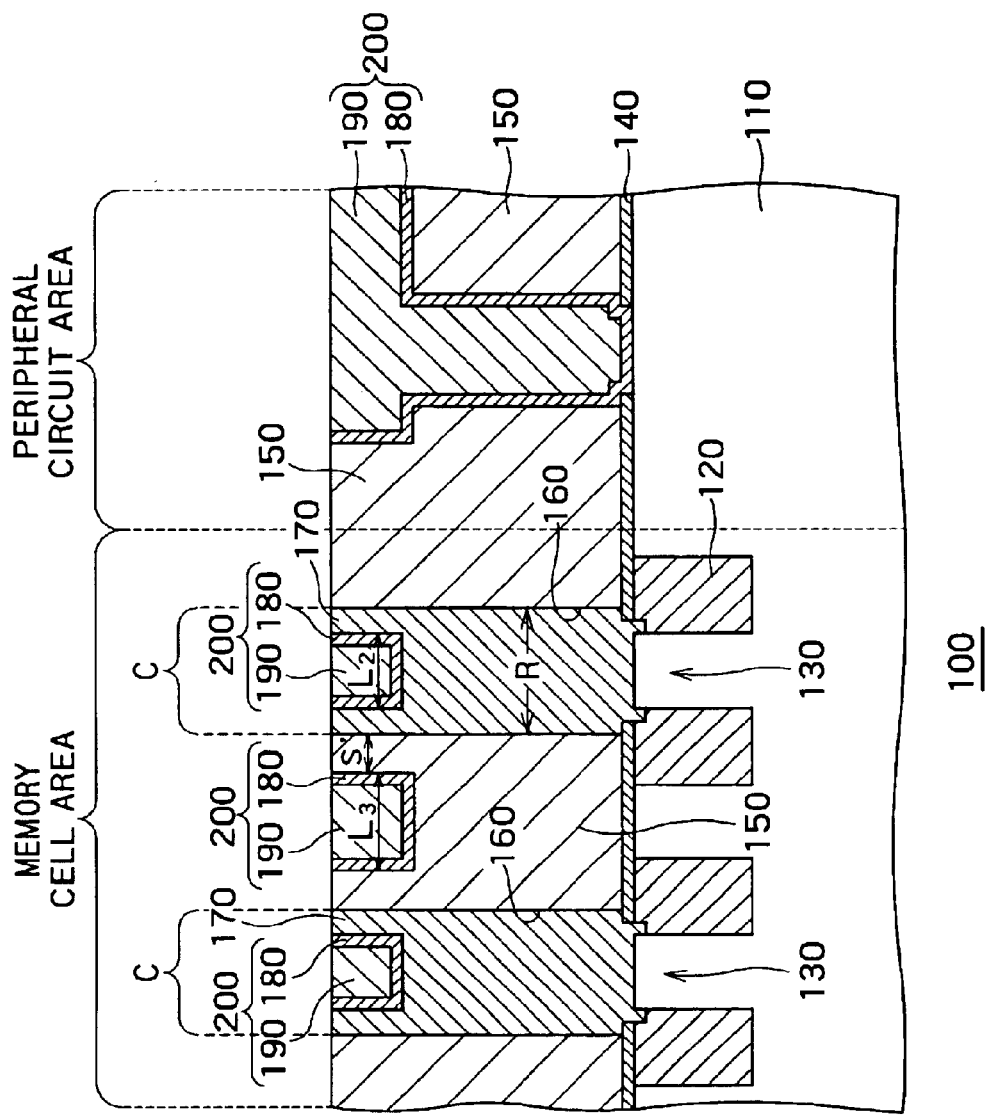
FIG. 2 is a cross-sectional view of the semiconductor device 100 shown in FIG. 1A, taken along the Y—Y line.

FIG. 2 is a cross-sectional view of the semiconductor device 100 shown in FIG. 1A, taken along the Y—Y line. The silicon substrate 110 includes element-isolating portions 120 and doped silicon regions 130 in its top surface region. A silicon nitride film 140 and a silicon oxide film 150 are formed to overlie the top surface of the silicon substrate 110. Contact holes 160 are formed to penetrate the silicon nitride film 140 and the silicon oxide film 150 and reach the doped silicon regions 130. Doped silicon 170 is buried in the contact holes 160, and thereby electrically connected to the doped silicon regions 130.

In each contact region C, interconnections 200 are buried inside the doped silicon 170. As a result, opposite side surfaces and the bottom surface of each interconnection 200 are in contact with the doped silicon 170, and the interconnection 200 is electrically connected to the doped silicon 170.

Outside the contact region C, each interconnection 200 is buried in the silicon oxide film 150. Thus, adjacent interconnections are prevented from short-circuiting.

According to this embodiment, width $L_2$ of the interconnection 200 inside each contact, region C is narrower than the diameter R of the contact hole 160. As a result, in each contact region C, the doped silicon 170 appears along the opposite sides of the interconnection 200 on the top surface level of the silicon oxide film 150.

Figure 5:
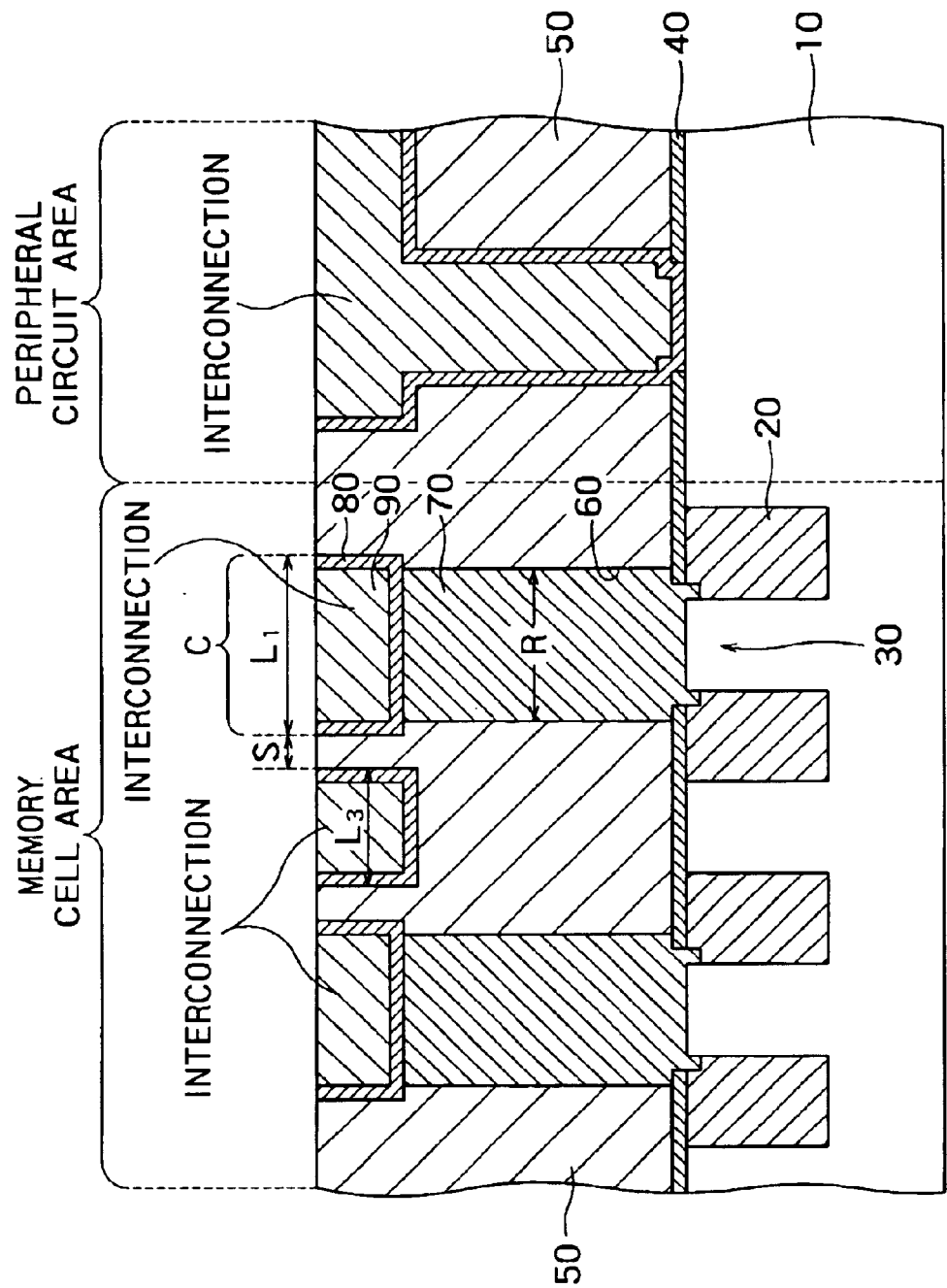
FIG. 5 is a cross-sectional view of the semiconductor device shown in FIG. 4A, taken along the X—X line.
Figure 6A:
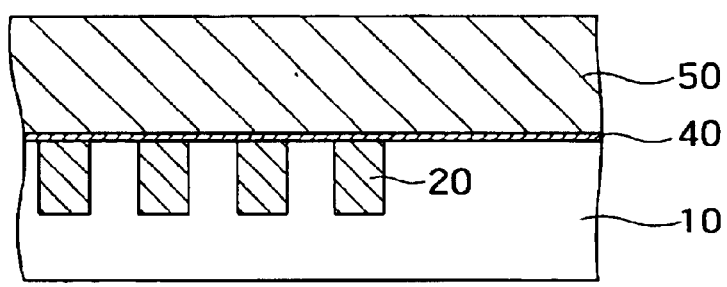
FIG. 6A is a cross-sectional view of an element for showing a conventional manufacturing method of a semiconductor device.
Figure 6B:
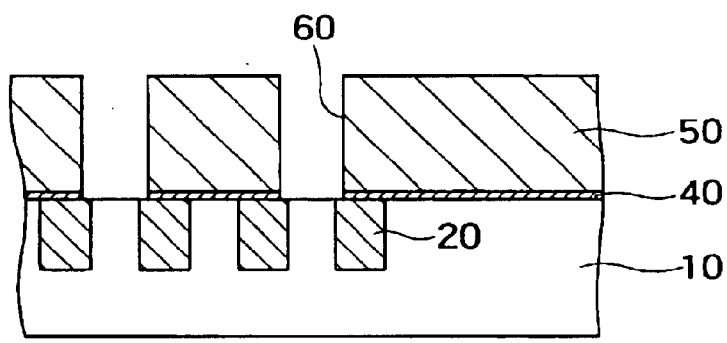
FIG. 6B is a cross-sectional view of the element under a manufacturing process next to FIG. 6A.
Figure 6C:
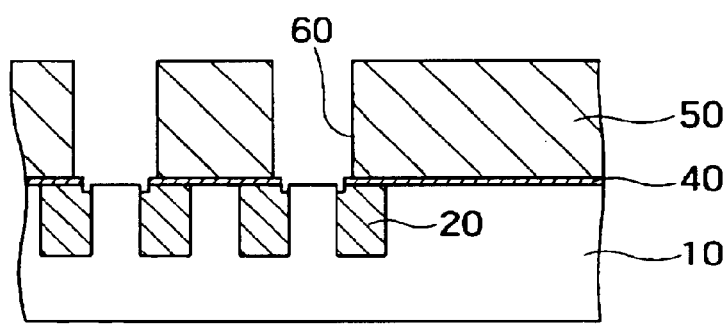
FIG. 6C is a cross-sectional view of the element under a manufacturing process next to FIG. 6B.
Figure 6D:
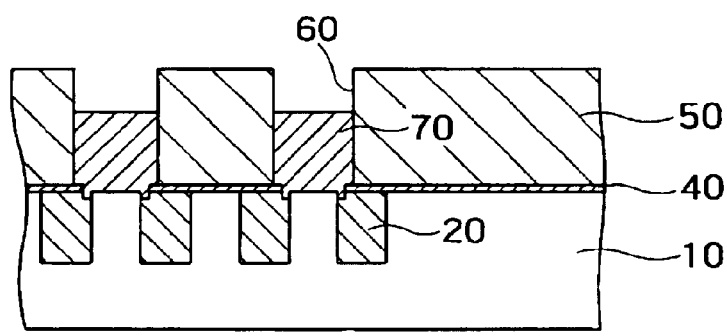
FIG. 6D is a cross-sectional view of the element under a manufacturing process next to FIG. 6C.
Figure 6E:
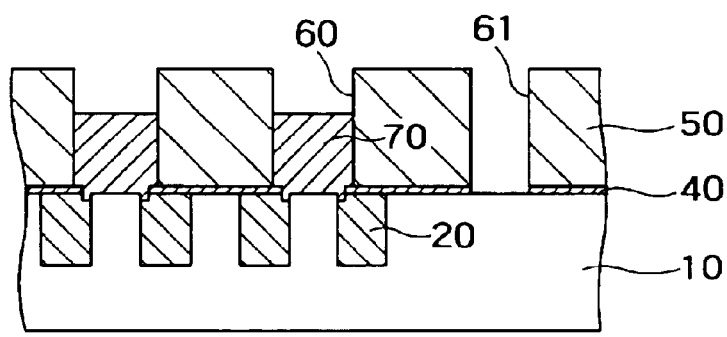
FIG. 6E is a cross-sectional view of the element under a manufacturing process next to FIG. 6D.
Figure 6F:
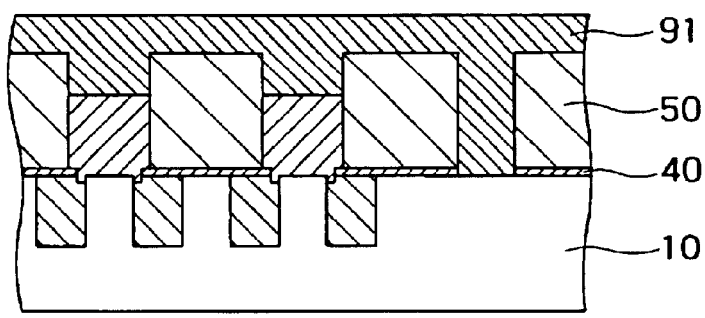
FIG. 6F is a cross-sectional view of the element under a manufacturing process next to FIG. 6E.
Figure 6G:
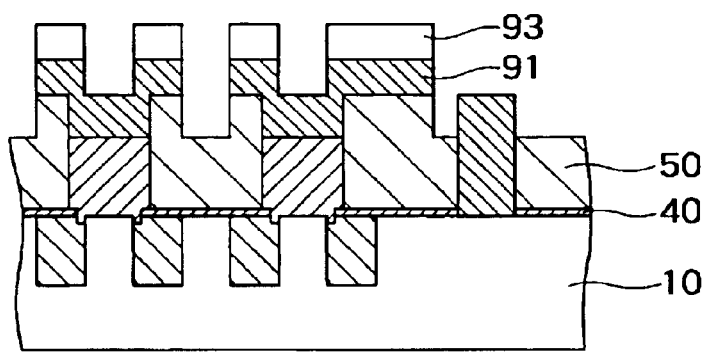
FIG. 6G is a cross-sectional view of the element under a manufacturing process next to FIG. 6F.
Figure 6H:
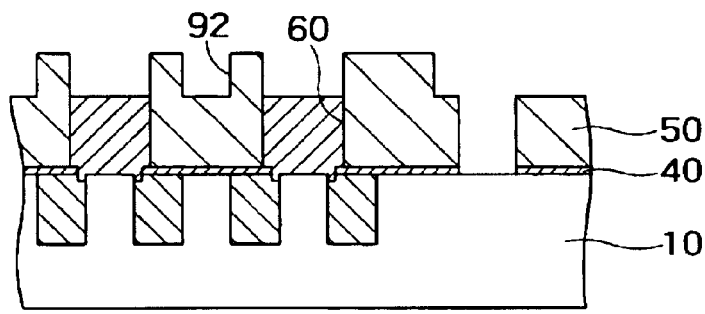
FIG. 6H is a cross-sectional view of the element under a manufacturing process next to FIG. 6G.
Figure 6I:
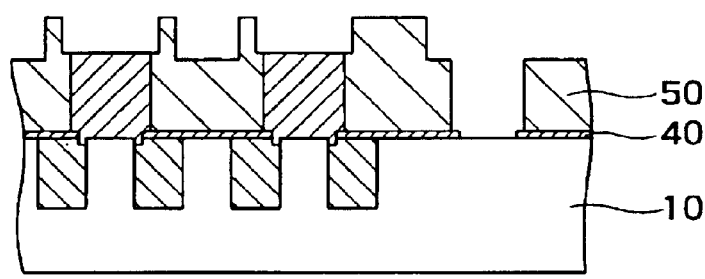
FIG. 6I is a cross-sectional view of the element under a manufacturing process next to FIG. 6H.
Figure 6J:
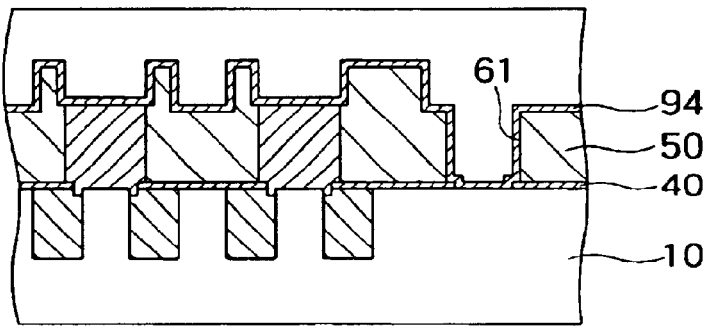
FIG. 6J is a cross-sectional view of the element under a manufacturing process next to FIG. 6I.

In addition, since the width $L_2$ of the interconnection 200 is narrower than the diameter R of the contact hole 160, spacing S' between adjacent interconnections 200 is larger than the conventional line-to-line spacing S (see FIG. 5).

This feature (S<S') is led from the fact that the sum of the line width of each bit line interconnection and the spacing width between adjacent bit line interconnections in the memory cell area is usually constant ($L_1$+S=R+S'), and that the conventional interconnection width $L_1$ is larger than the diameter R of the contact hole 160 ($L_1$<R).

As such, according to the embodiment, since the spacing between adjacent interconnections 200 is larger than the conventional one, short-circuiting between bit line interconnections in the memory cell area can be prevented.

The line width of the part of each interconnection 200 buried inside the silicon oxide film 150 is $L_3$ equal to the conventional one. In the peripheral circuit area, contacts and interconnections are formed solely of two metal compound layers, namely a titanium nitride layer 180 and a tungsten layer 190. The use of these two different kinds of contact between the memory cell area and the peripheral circuit area is explained as follows. For the contact in the memory cell area, the so-called borderless contact, which makes partly contact with the element-isolating region 120, is employed. Therefore, no metal material can be used as the contact for preventing the junction leak current of the contact. In contrast, in the peripheral circuit are, the so-called bordered contact, which does not make contact with the element-isolating region 120, is employed. Therefore, some metal material can be used as the contact.

Next explained is a manufacturing method of the semiconductor device 100. FIGS. 3A through 3L are cross-sectional view of an element, which shows the manufacturing method of the semiconductor device 100 in the order of its processes. Through the processes shown in FIGS. 3A through 3L, the bit line interconnections and the bit line contacts are formed by dual damascene process.

Figure 3A:
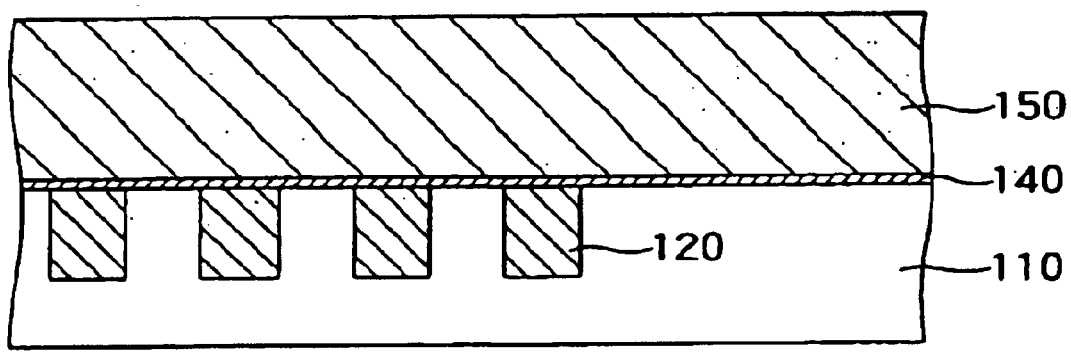
FIG. 3A is a cross-sectional view of an element for showing a manufacturing method of the semiconductor device 100.

In FIG. 3A, trench capacitors, impurity diffusion layers, gate interconnection layers (all not shown) and element-isolating portions 120 are already formed on a silicon substrate 110. In this process, a silicon nitride film 140 and a silicon oxide film 150 are deposited as a layer-to-layer insulating film on the top surface of the silicon substrate 110 to a thickness around of 20 nm and 600 nm, respectively, and the structure is planerized thereafter by CMP (chemical mechanical polishing).

Figure 3B:
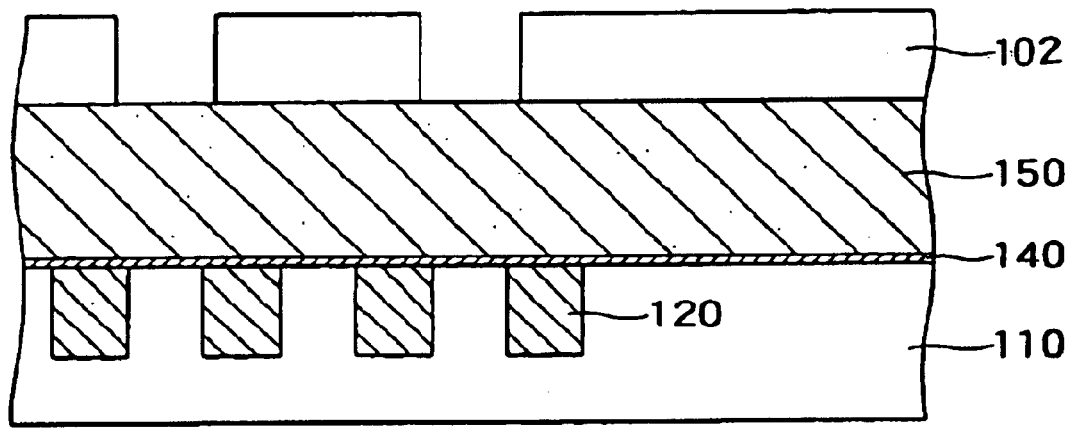
FIG. 3B is a cross-sectional view of the element under a manufacturing process next to FIG. 3A.

In FIG. 3B, for the purpose of forming the contact 160 of the bit lines in the memory cell area, a photo resist pattern 102 is formed on the silicon oxide film 150 by photolithography technique.

Figure 3C:
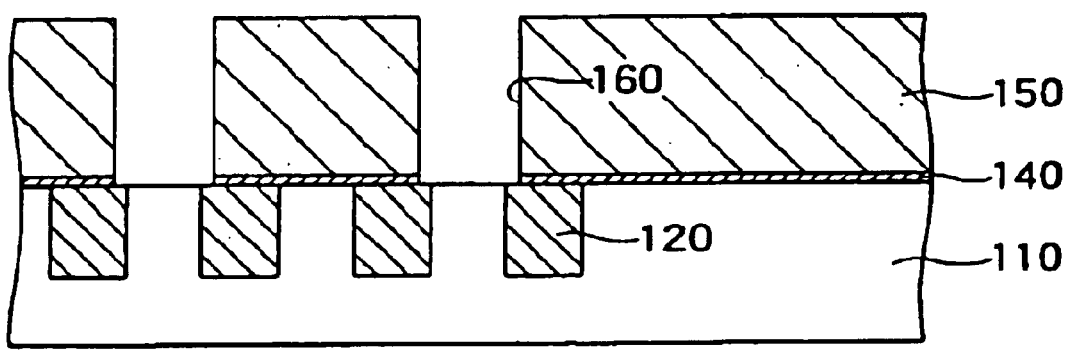
FIG. 3C is a cross-sectional view of the element under a manufacturing process next to FIG. 3B.

In FIG. 3C, the silicon oxide film 150 is next selectively removed by dry etching, using the silicon nitride film 140 as the stopper, and the silicon nitride film 140 is partly removed by dry etching. As a result, the contact holes 160 are created. After that, the photo resist pattern 102 is removed by ashing.

Figure 3D:
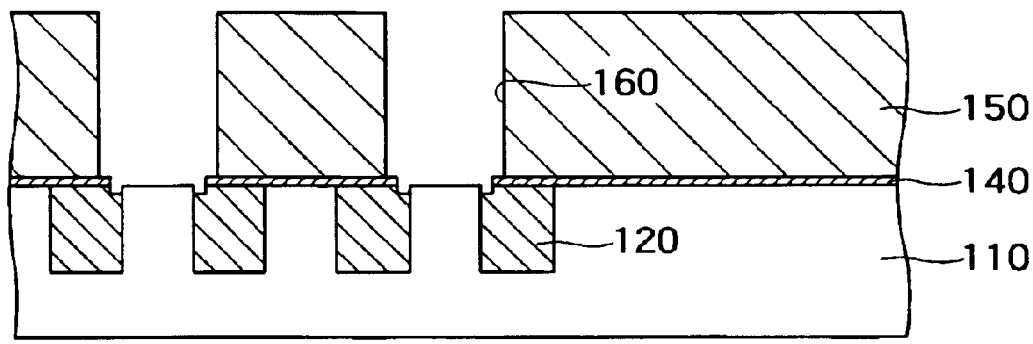
FIG. 3D is a cross-sectional view of the element under a manufacturing process next to FIG. 3C.

In FIG. 3D, the structure next undergoes processing by hydrofluoric acid to remove the naturally oxidized films on bottoms of the contact holes 160. This hydrofluoric acid processing is named the first hydrofluoric acid processing herein below. The first hydrofluoric acid processing has capability of etching the silicon thermal oxide film by approximately 5 nm. As a result of the first hydrofluoric acid processing, the element-isolating portions 120 and sidewalls of the contact holes 160 are slightly etched.

Figure 3E:
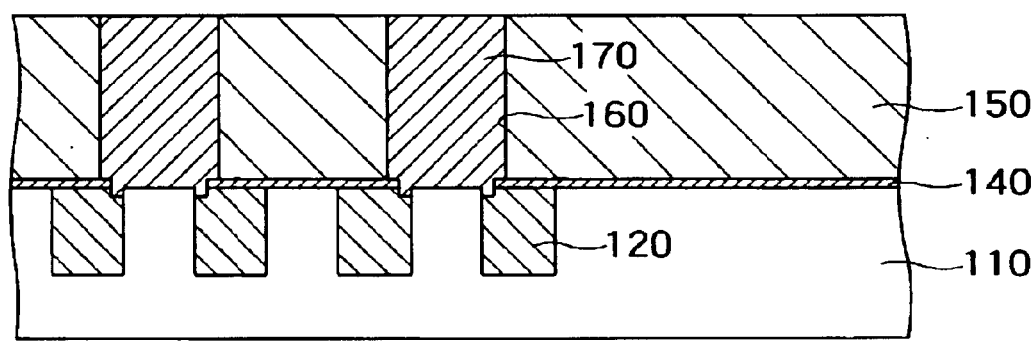
FIG. 3E is a cross-sectional view of the element under a manufacturing process next to FIG. 3D.

In FIG. 3E, doped silicon 170 doped with an impurity is next deposited to a thickness of around 30 nm by LP-CVD (low pressure chemical vapor deposition). The doped silicon 170 is removed from the top surface of the silicon oxide film 150 by CMP. As a result of this. process, the doped silicon 170 is filled in the contact holes 160.

Figure 3F:
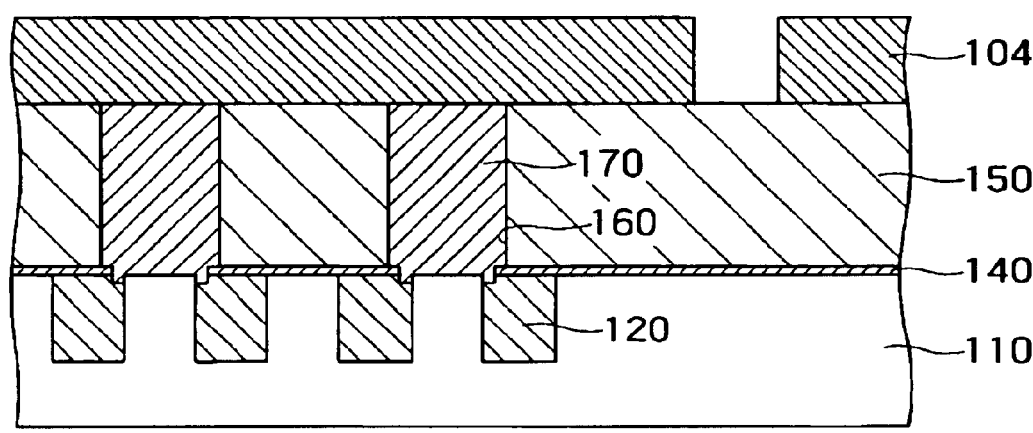
FIG. 3F is a cross-sectional view of the element under a manufacturing process next to FIG. 3E.

In FIG. 3F, for the purpose of forming contacts of the bit lines in the peripheral circuit area, a photo resist pattern 104 is formed by lithography.

Figure 3G:
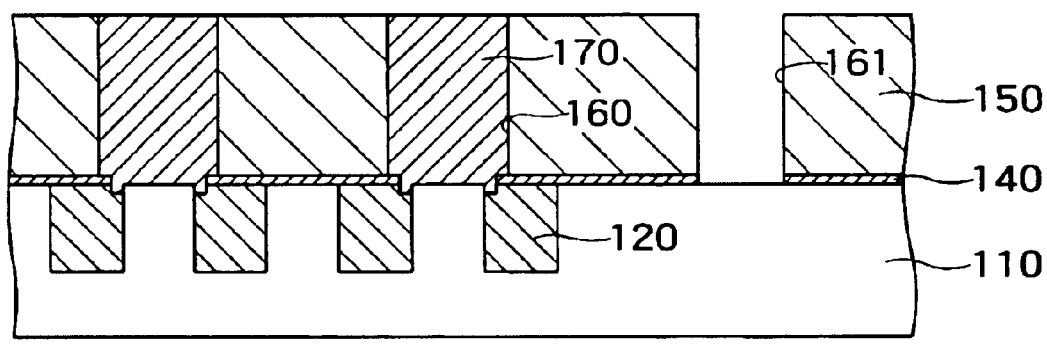
FIG. 3G is a cross-sectional view of the element under a manufacturing process next to FIG. 3F.

In FIG. 3G, the silicon oxide film 150 and the silicon nitride film 140 are selectively removed by dry etching, using the silicon substrate 110 as the stopper. Thereby, contact holes 161 of the bit lines are formed in the peripheral circuit area. The photo resist pattern 104 is removed thereafter by ashing.

Figure 3H:
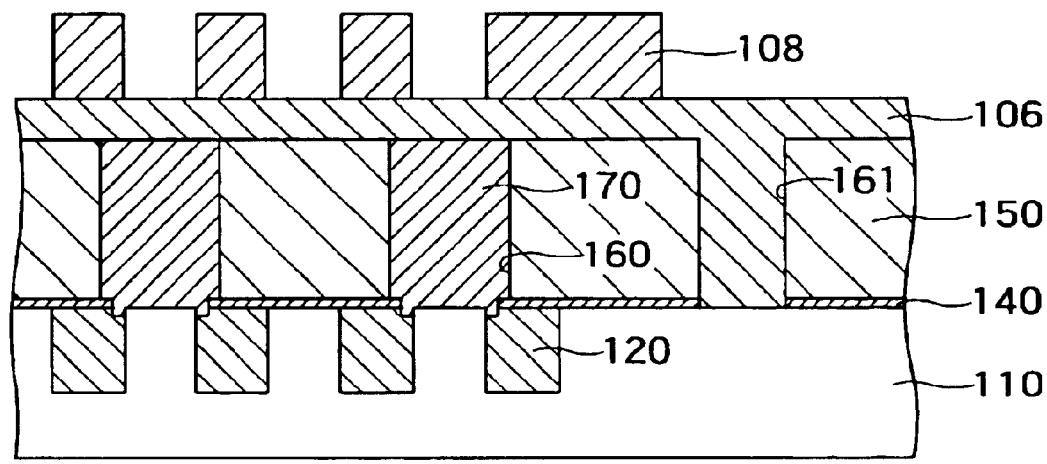
FIG. 3H is a cross-sectional view of the element under a manufacturing process next to FIG. 3G.

In FIG. 3H, for the purpose of forming the bit line interconnections 200, after a coat film 106 for preventing reflection is coated to a thickness around 100 nm, a photo resist pattern 108 is formed by lithography.

Figure 3I:
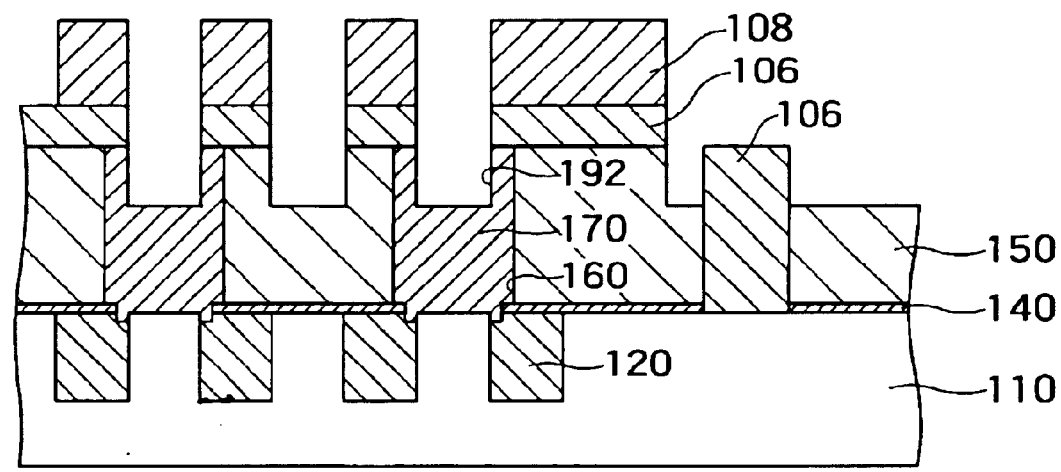
FIG. 3I is a cross-sectional view of the element under a manufacturing process next to FIG. 3H.

In FIG. 3I, the coat film 106, silicon oxide film 150 and doped polycrystalline silicon 170 are next selectively removed by dry etching to the depth of approximately 200 nm from the top surface of the silicon oxide film 150. As a result, interconnection trenches 192 for interconnections 200 are created.

Figure 3J:
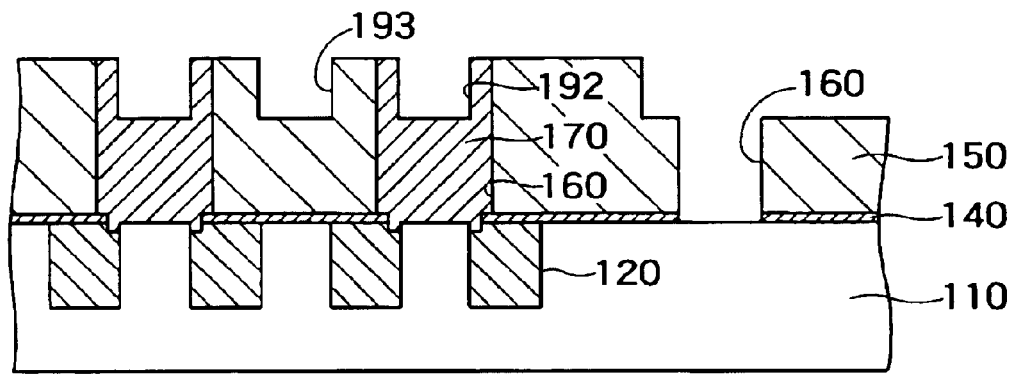
FIG. 3J is a cross-sectional view of the element under a manufacturing process next to FIG. 3I.

In FIG. 3J, the photo resist pattern 108 and the coat film 106 are removed by ashing.

Figure 3K:
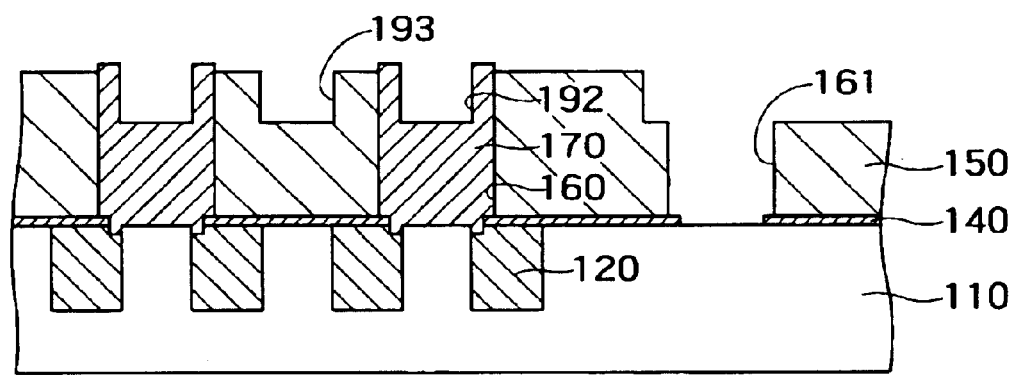
FIG. 3K is a cross-sectional view of the element under a manufacturing process next to FIG. 3J.

FIG. 3K, the structure undergoes hydrofluoric acid processing for the purpose of removing the naturally oxidized film on the exposed part of the silicon substrate 110 at the bottoms of the contact holes 161 and the naturally oxidized film on the top surface of the interconnection trenches 192 (top surfaces of the doped polycrystalline silicon 170). This hydrofluoric acid processing is named the second hydrofluoric acid processing herein below. The second hydrofluoric acid processing has capability of etching the silicon thermal oxide film by approximately 5 nm.

Since the silicon oxide film 150 is etched by the second hydrofluoric acid processing, side walls of the interconnection trenches 193 formed in the silicon oxide film 150 in the memory cell area are etched. As a result, the line width of the interconnection trenches 193 is enlarged. In addition, the diameter of the contact holes 161 in the peripheral circuit area is also enlarged by the second hydrofluoric acid processing.

On the other hand, the interconnection trenches 192 in the contact regions in the memory cell area are formed inside the doped silicon 170, and wide walls of the interconnection trenches 192 are formed of the doped polycrystalline silicon 170. Since the etching rate of polycrystalline silicon by fluoric acid is lower than that of the silicon oxide film, the line width of the interconnection trenches 192 does not increase as much as the interconnection trenches 193. Even if the line width of the interconnection trenches 192 increases, it does not matter because the width of the contact regions C (see FIG. 1) does not increase as far as the width of the interconnection trenches 192 remain narrower than the width of the doped polycrystalline silicon 170.

Figure 3L:
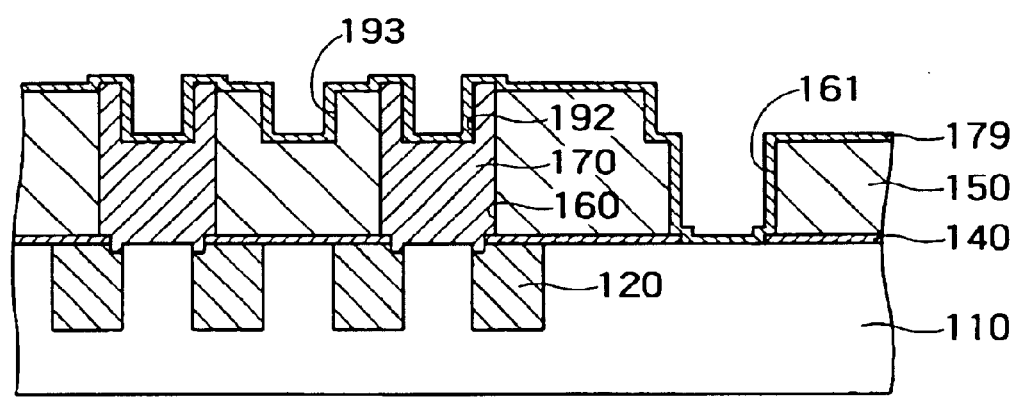
FIG. 3L is a cross-sectional view of the element under a manufacturing process next to FIG. 3K.
Figure 4B:
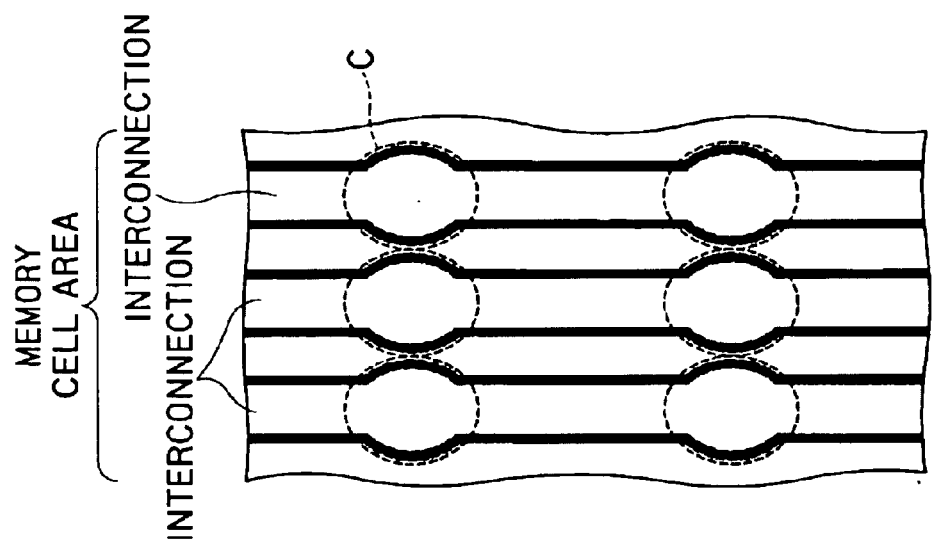
FIG. 4B is a plan view that shows part of bit line interconnections of a NAND-type product made by conventional dual damascene process in an enlarged scale.
Figure 4A:
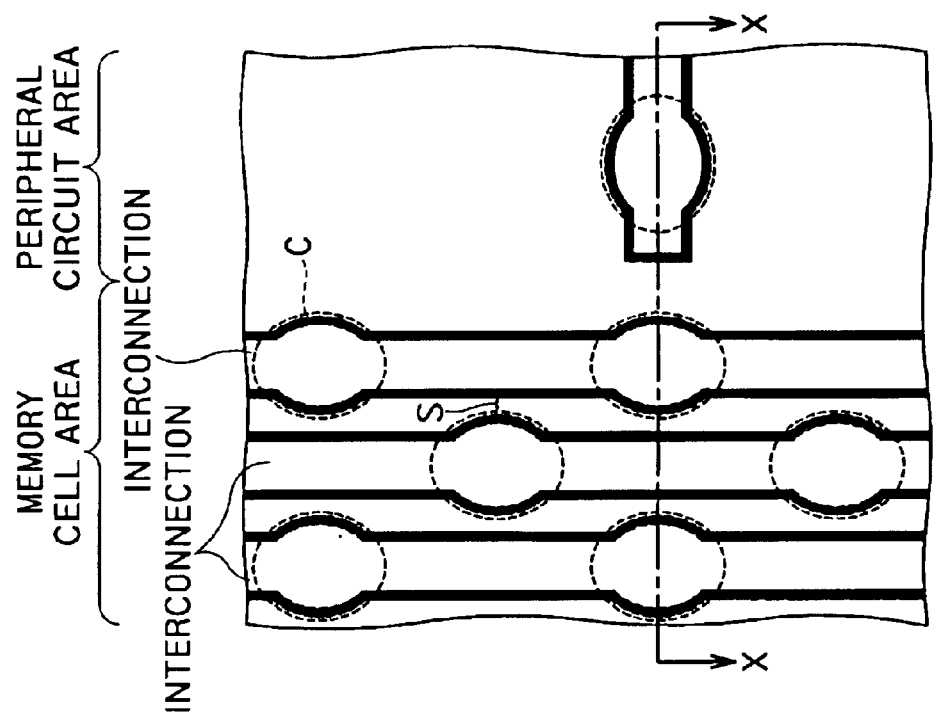
FIG. 4A is a plan view that shows part of bit line interconnections of a DRAM-type product made by conventional dual damascene process in an enlarged scale.

In FIG. 3L, a titanium layer 179 is deposited to a thickness around 30 nm by sputtering. In addition, by annealing the structure in a nitrogen gas atmosphere, part of the titanium layer 179 residing on side surfaces and bottoms of the interconnection trenches 192 inside the contact regions C and the titanium layer 179 residing on bottoms of the contact holes 161 are changed to titanium silicide, and the other part of the titanium layer 179 is changed to a titanium nitride layer 180. The titanium nitride layer 179 obtained by the annealing is used as a part of the interconnections, and the titanium silicide is used for contacts. The titanium silicide is not illustrated in the drawing because it is not clear which part of the titanium layer 179 changes to titanium silicide inside the contact regions.

After that, a tungsten layer 190 is deposited to a thickness around 400 nm, and partly removed together with the titanium nitride layer 180 to the top surface level of the silicon oxide film 150 by CMP. As a result of this process, the contact of the bit lines and bit line interconnections shown in FIG. 2 are made out.

In the semiconductor device manufacturing method according to the embodiment, the doped polycrystalline silicon 170 resides on the sidewalls of the interconnection trenches 192 during the second hydrofluoric acid processing. Therefore, the interconnection trenches 192 are prevented from laterally enlarging due to the second hydrofluoric acid processing. As a result, as shown in FIG. 1A, the width of each contact region C is narrower than the conventional one, and the interconnections 200 are prevented from short-circuiting.

Heretofore, the explanation has concerned about the DRAM product shown in FIG. 1A. However, embodiments of the invention are not limited to this but also applicable to other products having similar structures. For example, application to NAND products as shown in FIG. 1B is also possible.

In case of the NAND product shown in FIG. 1B, spacing between adjacent contact regions C in the memory cell area becomes wider than that the spacing between adjacent contact regions C of conventional NAND products. Therefore, also in NAND products, short-circuiting of the interconnections 200 can be prevented.

Note here that, in the embodiment of the invention, part of each interconnection 200 is in contact with a different material on the top surface of the silicon oxide film 150 as shown in FIG. 1. More. specifically, opposite sides of the interconnection 200 inside each contact region C are in contact with the doped polycrystalline silicon 170, and opposite sides of the interconnections 200 outside the contact regions C are in contact with the silicon oxide film 150.

In case the doped polycrystalline silicon 170 resides also outside the contact regions C, the interconnections 200 contacts a conductor such as doped polycrystalline silicon which has higher in resistance than the interconnections 200 also outside the contact regions C. As a result, the line width outside the contact regions C must be the width adding the conductor width to the width of the interconnections 200. Therefore, if it is attempted to keep the interconnection resistance as low as that of the embodiment, the line width will inevitably increase, and the possibility of short-circuiting between interconnections will increase. On the other hand, if it is attempted to keep the line width of the interconnections as narrow as that of the embodiment, the interconnection resistance will increase, and it will invite a decrease in the operation speed of the semiconductor device.

Therefore, the existence of the doped polycrystalline silicon 170 exclusively inside the contact regions makes it possible to form interconnections narrow in width and low in resistance.

Materials of individual component elements in the embodiment of the invention are not limited to specific ones. For example, the silicon substrate 110 may be a semiconductor containing gallium. The doped silicon 130 may be replaced by metal interconnections lying in a lower level than the interconnections 200. In case such metal interconnections are employed in lieu of the doped silicon 130, the semiconductor device will turn out a multi-layered interconnection structure. The silicon oxide film 150 may be an insulting material containing carbon. Although the tungsten layer 190 is, used as a part of he interconnection 200, any other appropriate low-resistance metal such as copper or aluminum may be used instead of the tungsten layer 190.

The semiconductor device according to the embodiment of the invention is a semiconductor device having line-to-line spacing between adjacent interconnections wider than the conventional spacing at the positions of the contact regions and therefore the design capable of preventing undesirable short-circuiting between adjacent interconnections.

What is claimed is:

1. A semiconductor device comprising:
   a first conductor formed inside or on the top surface of a semiconductor substrate;
   an insulating layer formed on the top surface of said semiconductor substrate or on the top surface of said first conductor;
   contact holes penetrating said insulating layer to reach said first conductor;
   a second conductor filled inside said contact holes and electrically connected to said first conductor; and
   an interconnection extending across contact regions on a top surface region of said insulating layer where said contact holes are formed respectively, and having opposite sides at least one of which is in contiguous contact with said second conductor on the surface of the insulating layer, said opposite sides extending in a direction perpendicular to the top surface of said insulating layer.

2. The semiconductor device according to claim 1, wherein both of said opposite sides of said interconnection are in contact with said second conductor inside said contact region.

3. The semiconductor device according to claim 2, wherein said second conductor is made of doped polycrystalline silicon, said insulating layer is made of a silicon oxide material, and said interconnection is made of a metallic material.

4. The semiconductor device according to claim 1, wherein both of said opposite sides of said interconnection are in contact with said insulating layer in the top surface region of said insulating layer outside said contact regions.

5. The semiconductor device according to claim 4, wherein said second conductor is made of doped polycrystalline silicon, said insulating layer is made of a silicon oxide material, and said interconnection is made of a metallic material.

6. The semiconductor device according to claim 1, wherein a plurality of said interconnections extend substantially in parallel on the top surface region of said insulating layer, and each said contact region is aligned substantially side by side with other said contact regions in a direction substantially normal to the extending direction of said interconnections on the top surface region of said insulating layer.

7. The semiconductor device according to claim 1, wherein said second conductor is made of doped polycrystalline silicon, said insulating layer is made of a silicon oxide material, and said interconnection is made of a metallic material.

8. A semiconductor device comprising:
   a first conductor formed inside or on the top surface of a semiconductor substrate;
   an insulating layer formed on the top surface of said semiconductor substrate or on the top surface of said first conductor,
   contact holes penetrating said insulating layer to reach said first conductor;
   a second conductor filled inside said contact holes and being electrically connected to said first conductor, and
   an interconnection extending across contact regions on a top surface region of said insulating layer where said contact holes are formed respectively, and having opposite sides, at least one of which is in contact with said second conductor inside said contact regions,
   wherein a diameter of each said contact hole is larger than the distance between opposite sides of said interconnection.

9. The semiconductor device according to claim 8, wherein said second conductor is made of doped polycrystalline silicon, said insulating layer is made of a silicon oxide material, and said interconnection is made of a metallic material.

10. A semiconductor device comprising:
    a first conductor formed inside or on the top surface of a semiconductor substrate;
    an insulating layer formed on the top surface of said semiconductor substrate or on the top surface of said first conductor;
    contact holes penetrating said insulating layer to reach said first conductor;
    a second conductor filled inside said contact holes and being electrically connected to said first conductor; and
    an interconnection extending across contact regions on a top surface region of said insulating layer where said contact holes are formed respectively, and having opposite sides, at least one of which is in contact with said second conductor inside said contact regions,
    wherein a plurality of said interconnections extend substantially in parallel on the top surface region of said insulating layer, and each said contact region is aligned substantially side by side with said interconnections other than said interconnection extending across said contact region in a direction substantially normal to the extending direction of said interconnections on the top surface region of said insulating layer.

11. A manufacturing method of a semiconductor device comprising:
    forming a first conductor inside or on the top surface of a semiconductor substrate;
    forming an insulating layer on the top surface of said semiconductor substrate or on the top surface of said first conductor;
    forming contact holes penetrating said insulating layer to reach said first conductor;
    filling a second conductor inside said contact holes;
    forming an interconnection trench which extends across contact regions on a top surface region of said insulating layer where said contact holes are formed respectively, said interconnection trench having a width narrower than the diameter of the contact holes; and
    filling a third conductor inside said interconnection trench.

12. A manufacturing method of a semiconductor device comprising:
    forming a first conductor inside or on the top surface of a semiconductor substrate;
    forming an insulating layer on the top surface of said semiconductor substrate or on the top surface of said first conductor;
    forming contact holes penetrating said insulating layer to reach said first conductor;

filling a second conductor inside said contact holes;

forming an interconnection trench which extends across contact regions on a top surface region of said insulating layer where said contact holes are formed respectively, and which extends across said second conductor inside said contact regions;

filling a third conductor inside said interconnection trench; and etching part of the side walls of said interconnection trench which are defined by said second conductor inside each said contact region and part of said side walls of said interconnection trench which are defined by said insulating layer outside said contact regions prior to burying said third conductor.

13. The manufacturing method of a semiconductor device according to claim 12, wherein said second conductor is made of doped polycrystalline silicon, said insulating layer is made of a silicon oxide material, and said interconnection is made of a metallic material.

* * * * *

UNITED STATES PATENT AND TRADEMARK OFFICE
CERTIFICATE OF CORRECTION

PATENT NO. : 6,759,333 B2
DATED : July 6, 2004
INVENTOR(S) : Okajima

It is certified that error appears in the above-identified patent and that said Letters Patent is hereby corrected as shown below:

Column 9,
Line 65, change "conductor," to -- conductor; --; and

Column 10,
Line 2, change "conductor," to -- conductor; --.

Signed and Sealed this

Seventh Day of December, 2004

JON W. DUDAS
*Director of the United States Patent and Trademark Office*